(12) United States Patent
Franklin et al.

(10) Patent No.: US 9,224,465 B2
(45) Date of Patent: Dec. 29, 2015

(54) CROSS-POINT MEMORY BIAS SCHEME

(71) Applicant: Intel Corporation, Santa Clara, CA (US)

(72) Inventors: Nathan R. Franklin, San Mateo, CA (US); Sandeep K. Guliani, Folsom, CA (US); Mase J. Taub, Folsom, CA (US); Kiran Pangal, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/221,572

(22) Filed: Mar. 21, 2014

(65) Prior Publication Data
US 2015/0269994 A1    Sep. 24, 2015

(51) Int. Cl.
*G11C 11/00* (2006.01)
*G11C 13/00* (2006.01)

(52) U.S. Cl.
CPC .......... *G11C 13/004* (2013.01); *G11C 13/0004* (2013.01)

(58) Field of Classification Search
CPC ........ G11C 16/26; G11C 11/56; G11C 16/00; G11C 16/28; G11C 16/3404; G11C 16/3418; G11C 2029/0409; G11C 29/02; G11C 29/026; G11C 29/028; G11C 29/42; G11C 29/50016; G11C 11/16; G11C 5/02; G11C 11/5642; G11C 16/0483

USPC ............... 365/185.03, 185.11, 185.17, 158, 365/185.09, 185.18, 210, 185.21
See application file for complete search history.

(56) References Cited

U.S. PATENT DOCUMENTS

| 2006/0120136 | A1 | 6/2006 | Dennison et al. |
| 2009/0073752 | A1 | 3/2009 | Fackenthal et al. |
| 2009/0168507 | A1 | 7/2009 | Petti |
| 2013/0051137 | A1 | 2/2013 | Zeng |
| 2014/0009997 | A1 | 1/2014 | Toda |
| 2015/0063021 | A1 * | 3/2015 | Castro et al. ................. 365/163 |

OTHER PUBLICATIONS

International Search Report and Written Opinion received for PCT Application No. PCT/US2015/019373 mailed on May 19, 2015, 10 pages.

* cited by examiner

*Primary Examiner* — Thong Q Le
(74) *Attorney, Agent, or Firm* — Grossman, Tucker, Perreault & Pfleger, PLLC

(57) ABSTRACT

The present disclosure relates to a cross-point memory bias scheme. An apparatus includes a memory controller including a word line (WL) control module and a bit line (BL) control module, the memory controller configured to initiate selection of a target memory cell; a sense module configured to determine whether the target memory cell has been selected; and a C-cell bias module configured to establish a C-cell bias if the target cell is not selected.

19 Claims, 3 Drawing Sheets

CROSS-POINT MEMORY BIAS SCHEME

FIELD

The present disclosure relates to a bias scheme for a cross-point memory.

BACKGROUND

Phase change memory is a memory device which typically uses a chalcogenide material for the memory elements. A memory element is the unit that actually stores information. In operation, the phase change memory stores information on the memory element by changing the phase of the memory element between amorphous and crystalline phases. The chalcogenide material may exhibit either a crystalline or an amorphous phase, exhibiting a low or high conductivity. Generally, the amorphous phase has a low conductivity (high impedance) and is associated with a reset state (logic zero) and the crystalline phase has a high conductivity (low impedance) and is associated with a set state (logic one). The memory element may be included in a memory cell that also includes a selector, i.e., a select device coupled to the memory element. The select devices are configured to facilitate combining a plurality of memory elements into an array.

Phase change memory elements may be arranged in a cross-point memory array including row address lines and column address lines arranged in a grid. The row address lines and column address lines, called word lines (WLs) and bit lines (BLs), respectively, cross in the formation of the grid and each memory cell is coupled between a WL and a BL where the WL and BL cross (i.e., cross-point). It should be noted that row and column are terms of convenience used to provide a qualitative description of the arrangement of WLs and BLs in cross-point memory.

A memory cell (e.g., a target memory cell) may be selected by applying bias voltages to the WL and BL that cross at the target memory cell, i.e., WL select voltage, $V_{SELWL}$, and BL select voltage, $V_{SELBL}$, respectively. A resulting target cell differential bias voltage ($V_{T\_SEL} = V_{SELBL} - V_{SELWL}$) across the memory element is configured to be greater than a threshold select voltage ($V_t$) for the memory element. It is desirable that $V_{T\_SEL}$ be large enough to reliably select the target cell but not so large as to inadvertently select other cells, particularly non-target cells included in the selected WL or selected BL.

One technique configured to ensure that $V_{T\_SEL}$ is large enough while avoiding selecting non-target cells is to apply a debias ("C-cell bias") voltage to deselected WLs and/or deselected BLs. C-cell bias is configured to reduce or maintain a bias voltage across non-target cells below $V_t$ when an increased $V_{T\_SEL}$ is applied to the target cell. The increased $V_{T\_SEL}$ is configured to increase the likelihood that the target cell will be selected. Continuously maintaining C-cell bias (i.e., whether or not a memory access has been initiated) increases leakage current in a cross-point array and increases idle current draw and idle power consumption.

Another technique that is configured to ensure that $V_{T\_SEL}$ is large enough while avoiding selecting non-target cells, enables C-cell bias for every memory cell selection operation. This technique is configured to avoid increasing leakage current and/or idle current draw but incurs a relatively high energy cost due to charging and discharging associated with establishing and removing the C-cell bias for every memory cell operation. Relatively large bus structures may be necessary to accommodate rapid charging of C-cell bias and/or relatively long delay times may be experienced to allow time enough for all of the memory cells to achieve C-cell bias prior to selecting the target cell.

BRIEF DESCRIPTION OF DRAWINGS

Features and advantages of the claimed subject matter will be apparent from the following detailed description of embodiments consistent therewith, which description should be considered with reference to the accompanying drawings, wherein:

Although the following Detailed Description will proceed with reference being made to illustrative embodiments, many alternatives, modifications, and variations thereof will be apparent to those skilled in the art.

DETAILED DESCRIPTION

Generally, this disclosure describes a system and method configured to expand an operation window of a cross-point memory array while minimizing effects on power, energy, die size and/or latency. The system and method are configured to attempt to select a target cell by applying a nominal bias voltage $V_{T\_SEL\_nominal}$ across the target cell without applying a C-cell bias and to detect whether or not the target cell has been selected. If the target cell has not been selected, then the C-cell bias may be applied and a bias voltage applied to the target cell may be increased by an amount related to the C-cell bias. The C-cell bias is configured to increase the operation window for the target cell when a selection threshold voltage $V_t$ is greater than $V_{T\_SEL\_nominal}$. Thus, the C-cell bias may be applied "on-demand", thereby avoiding increasing idle power consumption associated with continuously applied C-cell bias and avoiding relatively high energy costs associated with applying C-cell bias for every memory cell selection operation.

A selection threshold for a memory cell in the reset state is higher than a selection threshold for a memory cell in the set state. C-cell bias may typically be applied in write operations since read operations are configured to select memory cells in the set state and to avoid selecting cells in the reset state. In other words, a generally lower $V_{T\_SEL}$ may be used for read operations than is used for write operations.

Figure 1:
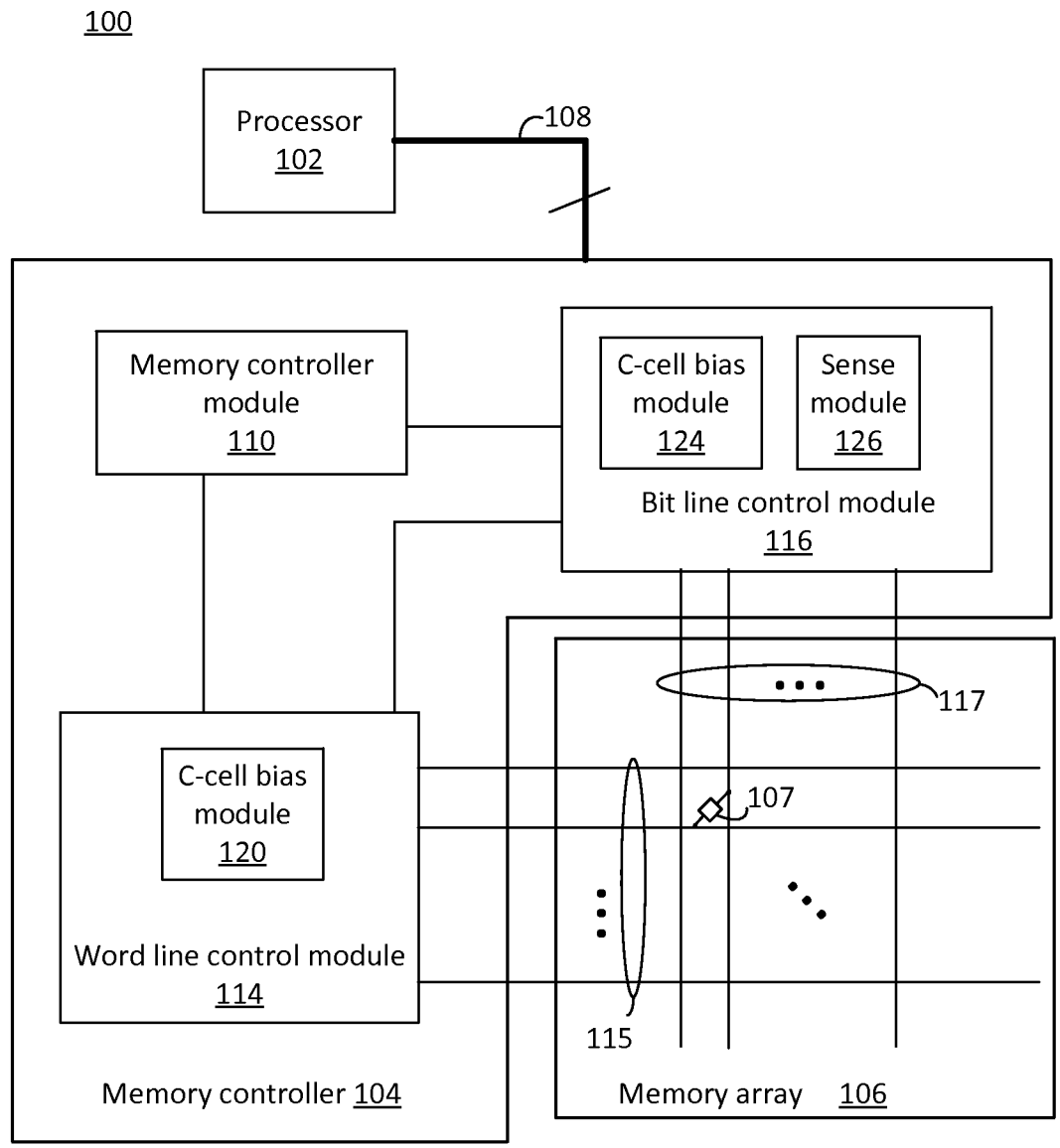
FIG. 1 illustrates a system block diagram consistent with several embodiments of the present disclosure.

FIG. 1 illustrates a system block diagram 100 consistent with several embodiments of the present disclosure. The system 100 includes a processor 102, a memory controller 104 and a memory array 106. The processor 102 is coupled to the memory controller 104 by bus 108. Processor 102 may provide read and/or write requests including memory address(es), and/or associated data to memory controller 104 and may receive read data from memory controller 104. It should be noted that system 100 is simplified for ease of illustration and description.

Memory array 106 corresponds to at least a portion of a phase change cross-point memory and includes a plurality of word lines 115, a plurality of bit lines 117 and a plurality of memory cells, e.g., memory cell 107. Each memory cell is coupled between a word line ("WL") and a bit line ("BL") at a cross point of the WL and the BL. Each memory cell includes a memory element configured to store information and may include a memory cell select device coupled to the memory element. Select devices may include ovonic threshold switches, diodes, bipolar junction transistors, field-effect transistors, etc. Memory array 106 is configured to store binary data and may be written to (i.e., programmed) or read from.

Memory controller 104 includes memory controller module 110, WL control module 114 and BL control module 116. Memory controller module 110 is configured to perform operations associated with memory controller 104. For example, memory controller module 110 may manage communications with processor 102. Memory controller module 110 may be configured to identify one or more target WLs associated with each received memory address. Memory controller module 110 is configured to manage operations of WL control module 114 and BL control module 116 based, at least in part, on the identified target WL.

WL control module 114 may include a C-cell bias module 120. WL control module 114 is configured to receive target WL address(es) from memory controller module 110 and to select one or more WLs for reading and/or writing operations. WL control module 114 may be configured to select a target WL by coupling $V_{SELWL}$ (i.e., WL select bias voltage) to the target WL and may be configured to deselect a WL by coupling a WL deselect bias voltage $V_{DESWL}$ to the WL. WL control module 114 may be coupled to a plurality of WLs 115 included in memory array 106. Each WL may be coupled to a number of memory cells corresponding to a number of BLs 117.

BL control module 116 may include a C-cell bias module 124 and/or a sense module 126. BL control module 116 is configured to select one or more BLs for reading and/or writing operations. BL control module 116 may be configured to select a target BL by coupling $V_{SELBL}$ (i.e., BL select bias voltage) to the target BL and may be configured to deselect a BL by coupling a BL deselect bias voltage $V_{DESBL}$ to the BL. WLs and BLs that are not selected may be coupled to deselect bias voltages, i.e., $V_{DESWL}$ and $V_{DESBL}$, respectively. Nominally, $V_{DESWL}$ and $V_{DESBL}$ are zero.

Figure 2:
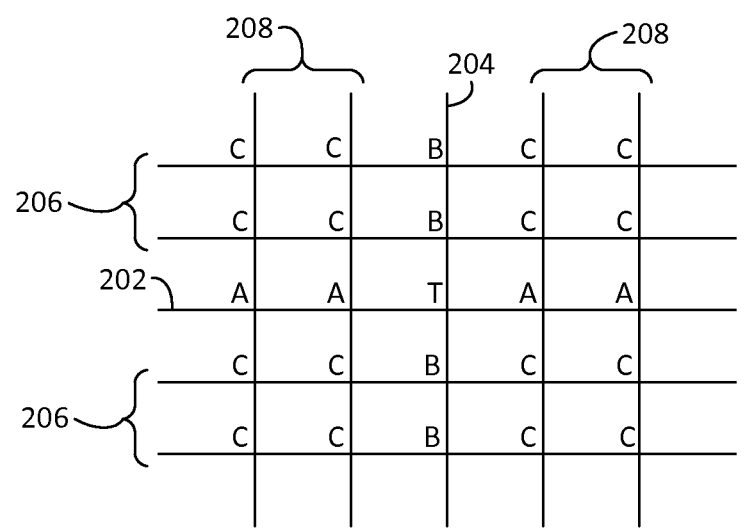
FIG. 2 illustrates an example portion of a cross-point memory array including a target cell, A cells, B cells and C cells consistent with one embodiment of the present disclosure.

FIG. 2 illustrates an example portion of a cross-point memory array 200 including a target cell (i.e., cell T), A-cells, B-cells and C-cells consistent with one embodiment of the present disclosure. For example, the portion of the cross-point memory array 200 may correspond to memory array 106 and cell T may correspond to cell 107 of FIG. 1. The example 200 includes a selected WL 202, a selected BL 204, a plurality of deselected WLs 206 and a plurality of deselected BLs 208. Example 200 includes one target cross-point memory cell T, a plurality of A-cells that are included in the selected WL 202 and a plurality of B-cells that are included in the selected BL 204. Example 200 further includes a plurality of C-cells (cross-points of deselected WLs 206 and deselected BLs 208).

The bias voltage across each of the A-cells is $V_A = V_{DESBL} - V_{SELWL}$. The bias voltage across each of the B-cells is $V_B = V_{SELBL} - V_{DESWL}$. The bias voltage across each of the C-cells is $V_C = V_{DESWL} - V_{DESBL}$. Nominally, $V_{DESWL}$ and $V_{DESBL}$ are zero and $V_{SELWL}$ and $V_{SELBL}$ are configured to select a target cell without also selecting an A-cell and/or a B-cell. C-cell bias corresponds to adjusting $V_{DESWL}$ and/or $V_{DESBL}$ to allow $V_{T\_SEL}$ to increase ($V_{T\_SEL} = V_{SELBL} - V_{SELWL}$) while maintaining $V_A$ and/or $V_B$ at their nominal values (that are less than $V_t$). $V_t$ is a target cell selection threshold voltage. In other words, $V_{T\_SEL}$ may be increased by increasing $V_{SELBL}$ and/or decreasing $V_{SELWL}$ but increasing $V_{SELBL}$ without changing $V_{DESWL}$ may cause $V_B$ to increase and decreasing $V_{SELWL}$ without changing $V_{DESBL}$ may cause $V_A$ to increase. C-cell bias is utilized to adjust $V_{DESWL}$ and/or $V_{DESBL}$ to maintain $V_A$ and/or $V_B$ below $V_t$ when $V_{T\_SEL}$ is increased.

A difference between $V_{T\_SEL}$ and a maximum of $V_A$, $V_B$ and $V_C$ corresponds to the operation window. C-cell bias may thus be utilized to increase the operation window by allowing $V_{T\_SEL}$ to increase while maintaining $V_A$ and $V_B$ at or near their nominal values. In other words, since $V_A$, $V_B$ and $V_C$ are configured to be less than $V_t$ for proper operation (i.e., selecting only target cell(s)), allowing $V_{T\_SEL}$ to increase while maintaining $V_A$ and $V_B$ at or near their nominal values increases the operation window.

WL control module 114 and BL control module 116 are configured to identify a target cell, e.g., cell T, for a memory access operation, e.g., in response to an input from processor 102 and/or memory controller module 110. WL control module 114 and BL control module 116 are configured to select target cell T by applying $V_{SELWL}$ and $V_{SELBL}$ to a selected WL, e.g., WL 202, and the selected BL, e.g., BL 204, respectively, thereby applying $V_{T\_SEL}$ across cell T. If $V_{T\_SEL}$ is greater than or equal to the target cell select threshold voltage $V_t$ then cell T may be selected.

Sense module 126 is configured to determine whether or not a target cell, e.g., cell T, is selected. When a memory cell is selected, the memory cell transitions from an OFF state to an ON state and a cell impedance state transitions from a relatively high impedance (e.g., greater than about 10 Megaohms (MΩ)) state to a relatively low impedance (e.g., less than about 10 kilo-ohms (kΩ)) state. When the impedance state of the memory cell is relatively low, the memory cell is "selected". Thus, sense module 226 may be configured to determine whether a target cell, e.g., cell T, has been selected based, at least in part, on the impedance state of the memory cell. For example, sense module 226 may be configured to sense a current through cell T (e.g., current directly or a voltage drop across a sense resistor). Thus, sense module 226 may determine that a cell is selected if the sensed current and/or voltage increases indicating that the impedance has decreased (for a fixed supply voltage).

If sense module 126 determines that cell T has been selected, memory access operation(s) (e.g., read and/or write) on cell T may proceed. If, after applying $V_{T\_SEL}$, sense module 126 determines that cell T has not been selected, C-cell bias module 120 is configured to apply C-cell bias to deselected WL(s) (e.g., deselected WL(s) 206) and/or C-cell bias module 124 is configured to apply C-cell bias to deselected BL(s) (e.g., deselected BL(s) 208). C-cell bias may be achieved by increasing $V_{DESWL}$ and/or decreasing $V_{DESBL}$ from their nominal value (e.g., zero) so that $V_C$ increases correspondingly. WL control module 114 and/or BL control module 116 may then be configured to increase $V_{T\_SEL}$ by increasing $V_{SELBL}$ and/or decreasing $V_{SELWL}$ by an amount related to the C-cell bias voltage $V_C$. The increased $V_{T\_SEL}$ is configured to select cell T (i.e., is configured to be greater than or equal to $V_t$) and the memory access operation may then proceed.

It may be appreciated that the selection threshold voltage $V_t$ for each memory cell in a cross-point array may vary due, at least in part, to variation in material properties and/or other characteristics of cross-point memory cells. For example, variation in $V_t$ of a cell may be due to geometric variation in the cell shape (e.g., thickness, width, length). Variation in cell shape may result in a variation in $V_t$ in the range of +/−10% of a nominal $V_t$ value. In another example, for some types of memory cells, over time, $V_t$ may increase due to drift and/or decrease due to thermal crystallization of the cell.

For example, $V_t$ for a specific memory cell may have a value between a minimum threshold voltage $V_{t\_MIN}$ and a maximum threshold voltage $V_{t\_MAX}$. For example, a sampling of a number of memory cells may yield a distribution of $V_t$ values between $V_{t\_MIN}$ and $V_{t\_MAX}$. Initially, $V_{T\_SEL}$ may be set to a nominal value (e.g., $V_{T\_SEL\_nominal}$) based, at least in part, on the distribution of $V_t$ values. For example, $V_{T\_SEL\_nominal}$ may be set to a value of $V_t$ that is greater than, e.g., approximately 50% of the $V_t$ values of the distribution of $V_t$ values. In another example, $V_{T\_SEL\_nominal}$ may be set to a value of $V_t$ that is greater than, e.g., approximately 80% of the $V_t$ values of the distribution of $V_t$ values. In this example, C-cell bias may be triggered in approximately 20% of the C-cell bias during operation of each of the memory cells. For example, C-cell bias may be applied during operation of approximately 20% of the memory cells, consistent with the present disclosure. Thus, idle power draw by C-cell bias may be avoided and energy "cost" associated with C-cell bias may be limited to only those cells that are not selected with $V_{T\_SEL\_nominal}$. A maximum current draw associated with a C-cell setup may be limited and a low latency C-cell setup may be allowed since only a few memory cells may utilize the C-cell bias in a specific memory access operation. A bus expansion configured to rapidly establish C-cell bias may thus be avoided.

Table 1 illustrates some example C-cell biasing schemes. In the table, V is volts and $V_{T\_SEL}$ is the bias voltage applied to the target cell.

TABLE 1

| Scheme | $V_{SELWL}$ | $V_{SELBL}$ | $V_{DESWL}$ | $V_{DESBL}$ | $V_A$ | $V_B$ | $V_C$ | $V_{T\_SEL}$ |
|---|---|---|---|---|---|---|---|---|
| Zero Bias C-cell | −4 V | +4 V | 0 V | 0 V | 4 V | 4 V | 0 V | 8 V |
| C-cell bias, Balanced WL & BL | −5 V | +5 V | +1 V | −1 V | 4 V | 4 V | 2 V | 10 V |
| C-cell bias, WL Only | −4 V | +6 V | +2 V | 0 V | 4 V | 4 V | 2 V | 10 V |
| On Demand, Expanded window | | | | | | | | |
| For $V_t \le 8$ V | −4 V | +4 V | 0 V | 0 V | 4 V | 4 V | 0 V | 8 V |
| For $8 V < V_t \le 10$ V | | +6 V | +2 V | 0 V | 4 V | 4 V | 2 V | 10 V | attempts to select a target memory cell (for write operations). The specific setting for $V_{T\_SEL\_nominal}$ may be selected based, at least in part, on characteristics of the distribution of $V_t$ values. In operation, C-cell bias may be triggered at a frequency related to the distribution. For example, relatively low trigger rates, e.g. less than 1%, may be possible.

If, during operation, $V_{T\_SEL}$ set to $V_{T\_SEL\_nominal}$ does not result in the target cell being selected, $V_{T\_SEL}$ may be set to a value greater than or equal to $V_{t\_MAX}$ in order to select the target cell. C-cell bias voltage $V_C$ may then be related to a difference between $V_{t\_MAX}$ and $V_{T\_SEL\_nominal}$. For example, $V_C$ may be equal to $V_{t\_MAX} - V_{T\_SEL\_nominal}$.

As described herein, $V_C = V_{DESWL} - V_{DESBL}$, thus, C-cell bias may be achieved by increasing $V_{DESWL}$ and/or decreasing $V_{DESBL}$. For example, to achieve $V_C$ of 2 volts, C-cell bias may be applied to a single side of the deselected cells, e.g., $V_{DESWL}$ may be increased to +2 volts and $V_{DESBL}$ may be maintained at zero volts. Of course, a single sided C-cell bias may be similarly achieved by decreasing $V_{DESBL}$ to −2 volts and maintaining $V_{DESWL}$ at zero volts. In another example, C-cell bias may be implemented as a dual-sided balanced approach, e.g., $V_{DESWL}$ may be increased to +1 volt and $V_{DESBL}$ may be decreased to −1 volt to achieve $V_C$ of 2 volts.

The single-sided approach is configured to switch voltage to and/or select half of the WLs and BLs as compared to the double-sided approach and, thus, may result in a relatively smaller switching energy cost associated with establishing the C-cell bias. One bias voltage source may be utilized to establish the single-sided C-cell bias compared to the double-sided approach which may rely on two bias voltage sources. The one bias voltage source may be implemented using an existing voltage source depending on the value of the bias voltage. Using an existing voltage source may reduce C-cell bias cost (e.g., die size, energy consumption, complexity).

Applying the C-cell bias when a target cell with $V_{T\_SEL}$ set to $V_{T\_SEL\_nominal}$ is not selected (i.e., when an increased operation window may be necessary) is configured to result in a relatively low average energy compared to approaches that either always apply C-cell bias to all cells all the time or apply The Zero Bias C-cell scheme illustrates example WL and BL voltages and resulting cell bias voltages for C-cell bias of zero, i.e., no C-cell bias. Thus, the target cell may be selected when $V_{T\_SEL} \ge 8$ volts and $V_t$ is 8 volts. The C-cell Bias with Balanced WL and BL corresponds to increasing $V_{DESWL}$ and decreasing $V_{DESBL}$ equally (i.e., balanced) to achieve the C-cell bias. The C-cell Bias, WL Only scheme is configured to increase only $V_{DESWL}$ to achieve the C-cell bias and increase the target cell bias voltage, $V_{T\_SEL}$.

The rows in the table below On Demand, Expanded window illustrate an example that corresponds to an embodiment consistent with present disclosure. In this example, when $V_t$ is less than or equal to 8 volts and $V_{T\_SEL}$ is 8V without C-cell bias (i.e., the target cell is selected without applying C-cell bias), C-cell bias is not applied. Continuing with this example, when $V_t$ is greater than 8 volts and less than or equal to 10 volts, a C-cell bias of 2V may be achieved by increasing $V_{DESWL}$ to +2V and $V_{SELBL}$ may then be increased to +6V to achieve a $V_{T\_SEL}$ of 10V. Of course, the a C-cell bias of 2V may be similarly achieved by decreasing $V_{DESBL}$ to −2V and $V_{SELWL}$ may be decreased to −6V to achieve a $V_T$ of 10V in order to select the target cell. Thus, consistent with the present disclosure, C-cell bias may be applied "on demand" and the operation window may be increased for those memory cell(s) that are not selected in response to $V_{T\_SEL}$ bias voltage set to $V_{T\_SEL\_nominal}$.

Figure 3:
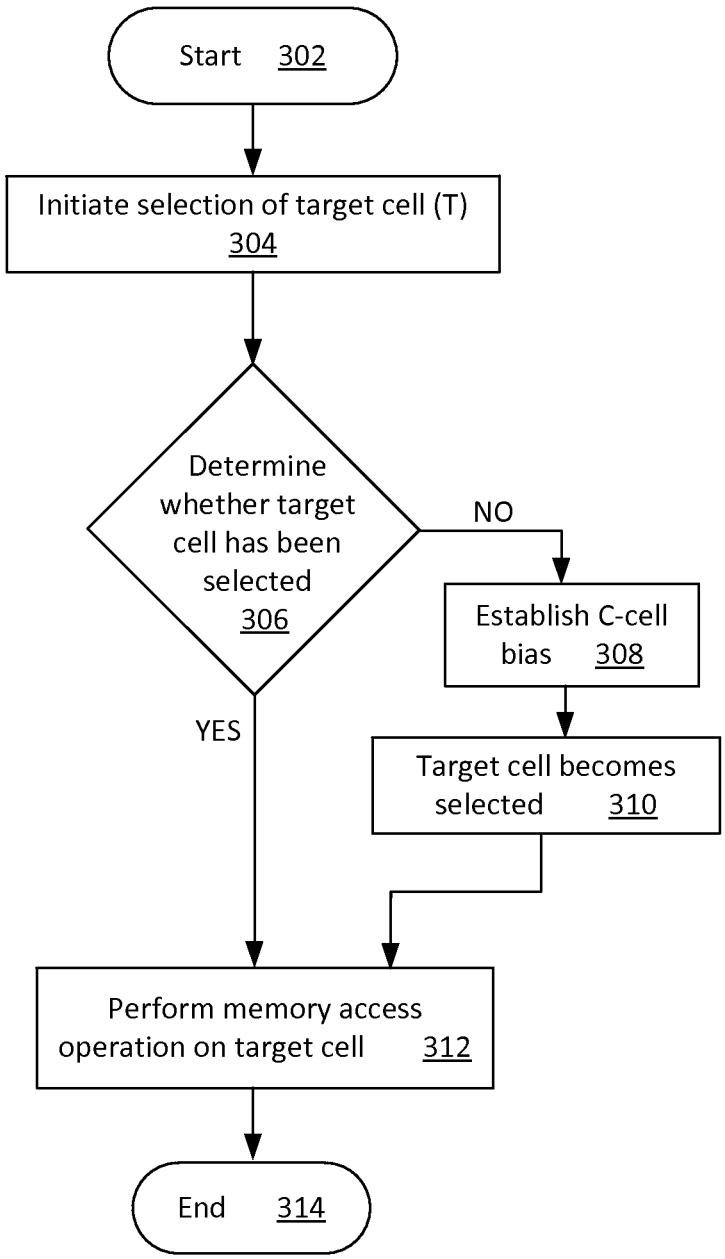
FIG. 3 illustrates a flowchart of operations for selectively applying a C-cell bias consistent with various embodiments of the present disclosure.

FIG. 3 illustrates a flowchart 300 of operations for selectively applying a C-cell bias consistent with various embodiments of the present disclosure. The operations may be performed, for example, by a memory controller, e.g., memory controller 104, including WL control module 114 and BL control module 116. Flowchart 300 depicts exemplary operations configured to selectively establish C-cell bias. In particular, flowchart 300 depicts exemplary operations configured to initiate selecting a target cell without C-cell bias and to establish C-cell bias if the target cell is not selected, as described herein.

Operations of flowchart 300 may begin start at operation 302. Selection of a target cell (T) may be initiated at operation 304. Whether the target cell has been selected may be determined at operation 306. If the target cell has not been selected, C-cell bias may be established at operation 308. The target cell may then become selected at operation 310. Program flow may then proceed to operation 312. If the target cell has been selected, a memory access operation may be performed at operation 312. For example, the memory access operation may include a read and/or a write (i.e., programming) operation. Program flow may then end at operation 314.

Thus, the operations of flowchart 300 are configured to attempt to select a target cell without C-cell bias and to establish C-cell bias if the attempt to select the target cell is not successful. C-cell bias may thus be established "on demand".

While FIG. 3 illustrates various operations according one embodiment, it is to be understood that not all of the operations depicted in FIG. 3 are necessary for other embodiments. Indeed, it is fully contemplated herein that in other embodiments of the present disclosure, the operations depicted in FIG. 3 and/or other operations described herein may be combined in a manner not specifically shown in any of the drawings, but still fully consistent with the present disclosure. Thus, claims directed to features and/or operations that are not exactly shown in one drawing are deemed within the scope and content of the present disclosure.

As used in any embodiment herein, the term "module" may refer to an app, software, firmware and/or circuitry configured to perform any of the aforementioned operations. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

"Circuitry", as used in any embodiment herein, may comprise, for example, singly or in any combination, hardwired circuitry, programmable circuitry such as computer processors comprising one or more individual instruction processing cores, state machine circuitry, and/or firmware that stores instructions executed by programmable circuitry. The modules may, collectively or individually, be embodied as circuitry that forms part of a larger system, for example, an integrated circuit (IC), system on-chip (SoC), desktop computers, laptop computers, tablet computers, servers, smart phones, etc.

In some embodiments, a hardware description language may be used to specify circuit and/or logic implementation(s) for the various modules and/or circuitry described herein. For example, in one embodiment the hardware description language may comply or be compatible with a very high speed integrated circuits (VHSIC) hardware description language (VHDL) that may enable semiconductor fabrication of one or more circuits and/or modules described herein. The VHDL may comply or be compatible with IEEE Standard 1076-1987, IEEE Standard 1076.2, IEEE1076.1, IEEE Draft 3.0 of VHDL-2006, IEEE Draft 4.0 of VHDL-2008 and/or other versions of the IEEE VHDL standards and/or other hardware description standards.

Thus, a system and method configured to initiate selection of a target cell without C-cell bias and to establish C-cell bias if the target cell is not selected has been described. The system and method are configured to attempt to select the target cell with a nominal bias voltage and to determine whether or not the target cell has been selected. If the target cell has not been selected, the system and method are configured to establish a C-cell bias and to then increase the target cell bias voltage an amount corresponding to the C-cell bias voltage to increase the operation window. Thus, C-cell bias may be implemented to increase the operation window when needed.

According to one aspect there is provided an apparatus. The apparatus includes a memory controller that includes a word line (WL) control module and a bit line (BL) control module. The memory controller is configured to initiate selection of a target memory cell. The apparatus further includes a sense module configured to determine whether the target memory cell has been selected and a C-cell bias module configured to establish a C-cell bias if the target cell is not selected.

According to another aspect there is provided a method. The method includes initiating, by a memory controller, selection of a target memory cell, determining, by a sense module, whether the target memory cell has been selected and establishing, by a C-cell bias module, a C-cell bias if the target cell is not selected.

According to another aspect there is provided a system. The system includes a processor, a cross-point memory array that includes a target memory cell, a target word line (WL) and a target bit line (BL). The target memory cell is coupled between the target word line and the target bit line. The system further includes a memory controller configured to initiate selection of the target memory cell. The memory controller includes a WL control module and a BL control module, a sense module configured to determine whether the target memory cell has been selected and a C-cell bias module configured to establish a C-cell bias if the target cell is not selected.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. An apparatus comprising:
a memory controller comprising a word line (WL) control module and a bit line (BL) control module, the memory controller configured to initiate selection of a target memory cell at least in part by coupling the target memory cell to a target memory cell select bias voltage, $V_{T\_SEL}$;
a sense module configured to determine whether the target memory cell has been selected by the coupling of the target memory cell to $V_{T\_SEL}$; and
a C-cell bias module configured to establish a C-cell bias when the sense module determines that the target memory cell is not selected by the coupling of the target memory cell to $V_{T\_SEL}$.

2. The apparatus of claim 1, wherein the C-cell bias module is configured to adjust at least one of a WL deselect bias voltage and a BL deselect bias voltage to establish the C-cell bias.

3. The apparatus of claim 1, wherein the memory controller is configured to increase $V_{T\_SEL}$ when the sense module determines that the target memory cell is not selected by the coupling of the target memory cell to $V_{T\_SEL}$.

4. The apparatus of claim 1, wherein the WL control module is configured to apply a WL select bias voltage, $V_{SELWL}$, to a target WL and the BL control module is configured to apply a BL select bias voltage, $V_{SELBL}$, to a target BL to initiate selection of the target memory cell, wherein $V_{T\_SEL}$ corresponds to a difference between $V_{SELBL}$ and $V_{SELWL}$.

5. The apparatus of claim 4, wherein the WL control module is configured to adjust $V_{SELWL}$ to increase $V_{T\_SEL}$ by an amount related to the C-cell bias when the target cell is not selected by the coupling of the target memory cell to $V_{T\_SEL}$.

6. The apparatus of claim 4, wherein the BL control module is configured to adjust $V_{SELBL}$ to increase $V_{T\_SEL}$ by an amount related to the C-cell bias when the target cell is not selected by the coupling of the target memory cell to $V_{T\_SEL}$.

7. A method comprising:
   initiating, by a memory controller, selection of a target memory cell at least in part by coupling the target memory cell to a target memory cell select bias voltage, $V_{T\_SEL}$;
   determining, by a sense module, whether the target memory cell has been selected by the coupling of the target memory cell to $V_{T\_SEL}$; and
   establishing, by a C-cell bias module, a C-cell bias when the sense module determines that the target memory cell is not selected by the coupling of the target memory cell to $V_{T\_SEL}$.

8. The method of claim 7, further comprising:
   adjusting, by the C-cell bias module, at least one of a WL deselect bias voltage and a BL deselect bias voltage to establish the C-cell bias.

9. The method of claim 7, further comprising:
   increasing, by the memory controller, $V_{T\_SEL}$ by an amount related to the C-cell bias when the target memory cell is not selected by the coupling of the target memory cell to $V_{T\_SEL}$.

10. The method of claim 7, wherein initiating selection of the target memory cell comprises:
    applying, by a WL control module, a WL select bias voltage, $V_{SELWL}$, to a target WL, and
    applying, by a BL control module, a BL select bias voltage, $V_{SELBL}$, to a target BL,
    wherein a difference between $V_{SELBL}$ and $V_{SELWL}$ corresponds to $V_{T\_SEL}$.

11. The method of claim 10, further comprising:
    adjusting, by the WL control module, $V_{SELWL}$ to increase $V_{T\_SEL}$ by an amount related to the C-cell bias when the target memory cell is not selected by the coupling of the target memory cell to $V_{T\_SEL}$.

12. The method of claim 10, further comprising:
    adjusting, by the BL control module, $V_{SELBL}$ to increase $V_{T\_SEL}$ by an amount related to the C-cell bias when the target cell is not selected by the coupling of the target memory cell to $V_{T\_SEL}$.

13. The method of claim 7, further comprising:
    performing, by the memory controller, at least one of a read operation and a write operation on the target memory cell.

14. A system comprising:
    a processor;
    a cross-point memory array comprising a target memory cell, a target word line (WL) and a target bit line (BL), the target memory cell coupled between the target word line and the target bit line; and
    a memory controller configured to initiate selection of the target memory cell, the memory controller comprising:
      a WL control module and a BL control module, a sense module configured to determine whether the target memory cell has been selected by the coupling of the target memory cell to a target memory cell select bias voltage $V_{T\_SEL}$, and
      a C-cell bias module configured to establish a C-cell bias when the sense module determine that the target memory cell is not selected by the coupling of the target memory cell to $V_{T\_SEL}$.

15. The system of claim 14, wherein the C-cell bias module is configured to adjust at least one of a WL deselect bias voltage and a BL deselect bias voltage to establish the C-cell bias.

16. The system of claim 14, wherein the memory controller is configured to increase $V_{T\_SEL}$ by an amount related to the C-cell bias when the target memory cell is not selected by the coupling of the target memory cell to $V_{T\_SEL}$.

17. The system of claim 14, wherein the WL control module is configured to apply a WL select bias voltage, $V_{SELWL}$, to a target WL and the BL control module is configured to apply a BL select bias voltage, $V_{SELBL}$, to a target BL to initiate selection of the target memory cell, wherein a difference between $V_{SELWL}$ and $V_{SELBL}$ corresponds to $V_{T\_SEL}$.

18. The system of claim 17, wherein the WL control module is configured to adjust $V_{SELWL}$ to increase the $V_{T\_SEL}$ by an amount related to the C-cell bias when the target memory cell is not selected by the coupling of the target memory cell to $V_{T\_SEL}$.

19. The system of claim 17, wherein the BL control module is configured to adjust $V_{SELBL}$ to increase $V_{T\_SEL}$ when the target memory cell is not selected by the coupling of the target memory cell to $V_{T\_SEL}$.

* * * * *